US009842801B2

(12) United States Patent
Wei et al.

(10) Patent No.: US 9,842,801 B2
(45) Date of Patent: Dec. 12, 2017

(54) SELF-ALIGNED VIA AND AIR GAP

(71) Applicant: GLOBALFOUNDRIES INC., Grand Cayman (KY)

(72) Inventors: Andy Chih-Hung Wei, Queensbury, NY (US); Mark A. Zaleski, Galway, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/155,569

(22) Filed: May 16, 2016

(65) Prior Publication Data

US 2016/0260666 A1   Sep. 8, 2016

Related U.S. Application Data

(62) Division of application No. 14/270,660, filed on May 6, 2014, now Pat. No. 9,368,395.

(51) Int. Cl.

| H01L 29/06 | (2006.01) |
| H01L 23/522 | (2006.01) |
| H01L 21/768 | (2006.01) |
| H01L 23/48 | (2006.01) |
| H01L 23/528 | (2006.01) |
| H01L 23/532 | (2006.01) |

(52) U.S. Cl.
CPC ...... *H01L 23/5226* (2013.01); *H01L 21/7682* (2013.01); *H01L 21/76802* (2013.01); *H01L 21/76805* (2013.01); *H01L 21/76807* (2013.01); *H01L 21/76834* (2013.01); *H01L 21/76877* (2013.01); *H01L 21/76897* (2013.01); *H01L 23/481* (2013.01); *H01L 23/5283* (2013.01); *H01L 23/5329* (2013.01); *H01L 29/0649* (2013.01); *H01L 21/76883* (2013.01)

(58) Field of Classification Search
CPC .................................................. H01L 29/0649
See application file for complete search history.

(56) References Cited

U.S. PATENT DOCUMENTS

| 6,297,554 | B1 * | 10/2001 | Lin | ............... H01L 21/76808 |
| | | | | 257/752 |
| 2009/0224408 | A1 * | 9/2009 | Fox | ............... G06F 17/5068 |
| | | | | 257/773 |
| 2011/0143533 | A1 * | 6/2011 | Jiang | ............... H01L 21/76811 |
| | | | | 438/653 |

(Continued)

*Primary Examiner* — Peniel M Gumedzoe
*Assistant Examiner* — Christopher Johnson
(74) *Attorney, Agent, or Firm* — Williams Morgan, P.C.

(57) ABSTRACT

Provided are approaches for forming a self-aligned via and an air gap within a semiconductor device. Specifically, one approach produces a device having: a first metal line beneath a second metal line within an ultra low-k (ULK) dielectric, the first metal line connected to the second metal line by a first via; a dielectric capping layer formed over the second metal line; a third metal line within first and second via openings formed within a ULK fill material formed over the dielectric capping layer, wherein the third metal line within the first via opening extends to a top surface of the dielectric capping layer, and wherein the third metal line within the second via opening is connected to the second metal by a second via passing through the dielectric capping layer; and an air gap formed between the third metal line within the first and seconds via openings.

12 Claims, 15 Drawing Sheets

(56) References Cited

U.S. PATENT DOCUMENTS

2012/0273958 A1\* 11/2012 Kim .................... H01L 23/5226
 257/774
2013/0207276 A1\* 8/2013 Tseng ...................... H01L 24/05
 257/774

\* cited by examiner

SELF-ALIGNED VIA AND AIR GAP

RELATED APPLICATIONS

This application is a divisional application of U.S. Ser. No. 14/270,660 filed May 6, 2014.

BACKGROUND

Technical Field

This invention relates generally to the field of semiconductors, and more particularly, to approaches used in forming a self-aligned via (SAV) and air gap within a semiconductor device.

Related Art

As process dimensions continue to shrink, litho-etch patterning for semiconductor devices is typically required to print 64 nanometer (nm) pitch metal layers (Mx levels) or below. However, poor overlay can be a significant factor for consideration in successful patterning applications. For example, without self-aligned via (SAV) processes, the dielectric space between copper lines and vias may become small, which can cause reliability issues. Furthermore, current SAV processes are typically self-aligned only in one direction. A weak point for the reliability failure mechanism of time dependent dielectric breakdown (herein "TDDB") can form due to the proximity of the via bottom to an unrelated metal beneath it. A breakdown can occur along this interface leading to increased leakage or a dead short, thus compromising product functionality.

SUMMARY

In general, provided are approaches for forming a self-aligned via (SAV) and an air gap within a semiconductor device. Specifically, at least one approach generates a device having: a first metal line beneath a second metal line within an ultra low-k (ULK) dielectric, the first metal line connected to the second metal line by a first via; a dielectric capping layer formed over the second metal line; a third metal line within first and second via openings formed within a ULK fill material formed over the dielectric capping layer, wherein the third metal line within the first via opening extends to a top surface of the dielectric capping layer, and wherein the third metal line within the second via opening is connected to the second metal by a second via passing through the dielectric capping layer; and an air gap formed between the third metal line within the first and second via openings. As such, the device and its associated approaches provide at least the following advantages: a 2-D SAV, lower capacitance due to the air gap, and no ULK etch damage. Furthermore, these approaches allow for a minimal number of masking steps, including no extra mask for the air gap because the air gap is self-forming in a tight pitch area between the third metal line within the first and seconds via openings, and a simpler via (block) mask and integration.

One aspect of the present invention includes a method of forming a semiconductor device, the method comprising: providing a first metal line beneath a second metal line within an ultra low-k (ULK) dielectric, the first metal line connected to the second metal line by a via; forming a set of sacrificial pillars over the second metal line; depositing an ULK fill material over the semiconductor device, wherein an air gap is formed between the set of sacrificial pillars; removing the set of sacrificial pillars to form a set of via openings; forming a block mask over a first via opening of the set of via openings; etching the dielectric capping layer within a second via opening of the set of via openings; removing the block mask; and depositing a metal material over the semiconductor device to form a third metal line within the first via opening and the second via opening.

Another aspect of the present invention includes a method of forming a self-aligned via (SAV) and air gap within a semiconductor device, the method comprising: providing a first metal line beneath a second metal line within an ultra low-k (ULK) dielectric, the first metal line connected to the second metal line by a via; forming a set of sacrificial pillars over the second metal line; depositing an ULK fill material over the semiconductor device, wherein an air gap is formed between the set of sacrificial pillars; removing the set of sacrificial pillars to form a set of via openings; forming a block mask over a first via opening of the set of via openings; etching the dielectric capping layer within a second via opening of the set of via openings; removing the block mask; and depositing a metal material over the semiconductor device to form a third metal line within the first via opening and the second via opening.

Yet another aspect of the invention includes a semiconductor device comprising: a first metal line beneath a second metal line within an ultra low-k (ULK) dielectric, the first metal line connected to the second metal line by a first via; a dielectric capping layer formed over the second metal line; a third metal line within a first via opening and a second via opening formed within an ultra low-k (ULK) fill material formed over the dielectric capping layer, wherein the third metal line within the first via opening extends to a top surface of the dielectric capping layer, and wherein the third metal line within the second via opening is connected to the second metal by a second via passing through the dielectric capping layer; and an air gap formed between the third metal line within the first via opening and the third metal line within the second via opening.

BRIEF DESCRIPTION OF THE DRAWINGS

These and other features of this invention will be more readily understood from the following detailed description of the various aspects of the invention taken in conjunction with the accompanying drawings in which.

Figure 1A:
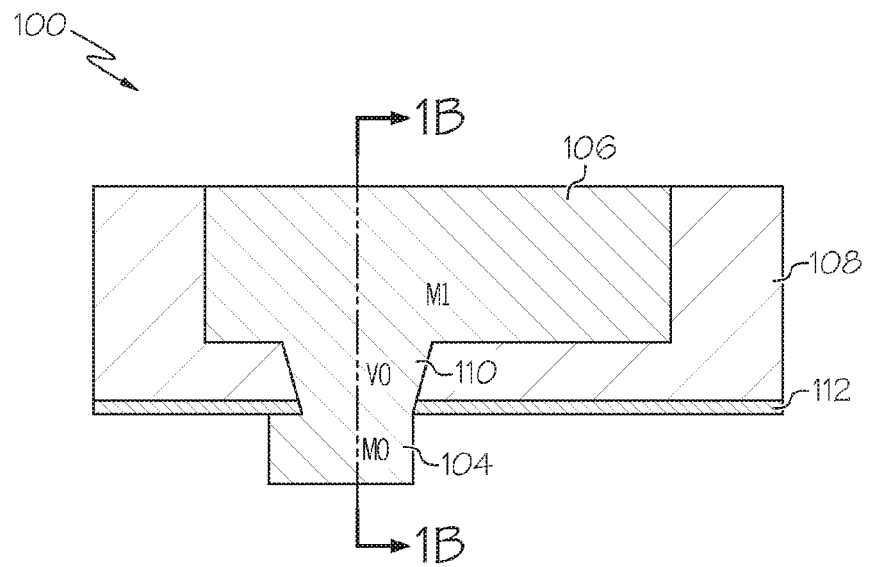
FIGS. 1(A)-(B) show side cross-sectional views of a semiconductor device including a first metal line beneath a second metal line within an ultra low-k (ULK) dielectric, the first metal line connected to the second metal line by a via, according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which one or more approaches are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

As stated above, provided are approaches for forming a 2-dimensional (2-D) self-aligned via (SAV) and an air gap within a semiconductor device. Specifically, at least one approach generates a device having: a first metal line beneath a second metal line within an ultra low-k (ULK) dielectric, the first metal line connected to the second metal line by a first via; a dielectric capping layer formed over the second metal line; a third metal line within first and second via openings formed within a ULK fill material formed over the dielectric capping layer, wherein the third metal line within the first via opening extends to a top surface of the dielectric capping layer, and wherein the third metal line within the second via opening is connected to the second metal by a second via passing through the dielectric capping layer; and an air gap formed between the third metal line within the first and seconds via openings. As such, the device and its associated approaches provide at least the following advantages: a 2-D SAV, lower capacitance due to the air gap, and no ULK etch damage. Furthermore, these approaches allow for a minimal number of masking steps, including no extra mask for the air gap because the air gap is self-forming in a tight pitch area between the third metal line within the first and seconds via openings, and a simpler via (block) mask and integration.

Figure 1B:
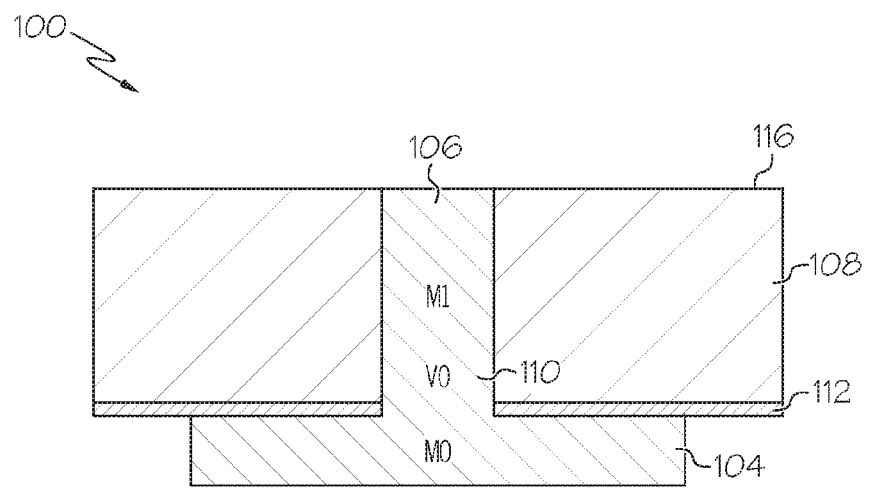

With reference now to the figures, FIG. 1(A) shows a side cross-sectional view of a semiconductor device 100, while FIG. 1(B) shows another side cross-sectional view of semiconductor device 100 along cut line 1(b)-1(b). As shown, the cross-sectional view of FIG. 1(A) is generally perpendicular to the cross-sectional view of FIG. 1(B). It will be appreciated that the two views and cut line demonstrated by FIGS. 1(A)-(B) are similarly applied to FIGS. 2-15.

Device 100 of FIGS. 1(A)-(B) comprises a first metal line (M0) 104 beneath a second metal line (M1) 106 within an ultra low-k (ULK) dielectric 108, first metal line 104 connected to second metal line 106 by a via (V0) 110 formed in ULK dielectric 108. Device 100 further comprises a dielectric layer 112 between first metal line 104 and ULK dielectric 108.

In an embodiment, ULK dielectric 108 has a permittivity less than that of silicon dioxide, e.g., less than approximately 3.9. In one embodiment, ULK dielectric 108 is a material such as, but not limited to, a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric. In one embodiment, ULK dielectric 108 is a porous SiCOH layer having a dielectric constant of less than 2.7.

Figure 2A:
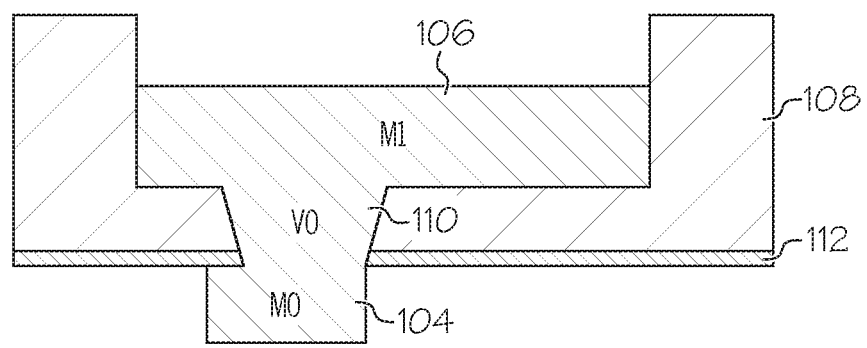
FIGS. 2(A)-(B) show side cross-sectional views of the semiconductor device wherein the second metal line is recessed according to illustrative embodiments.
Figure 2B:
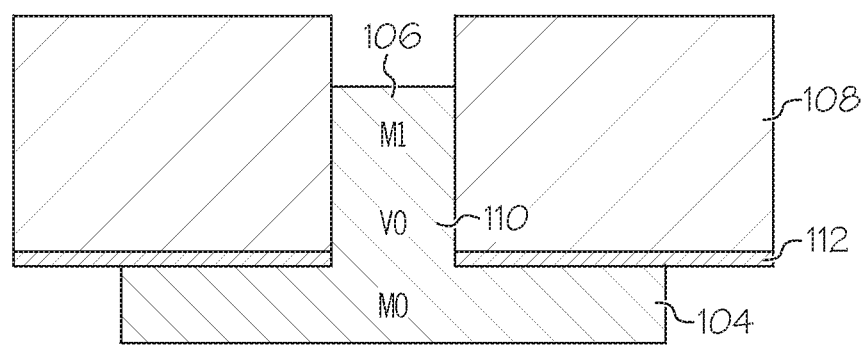
Figure 3A:
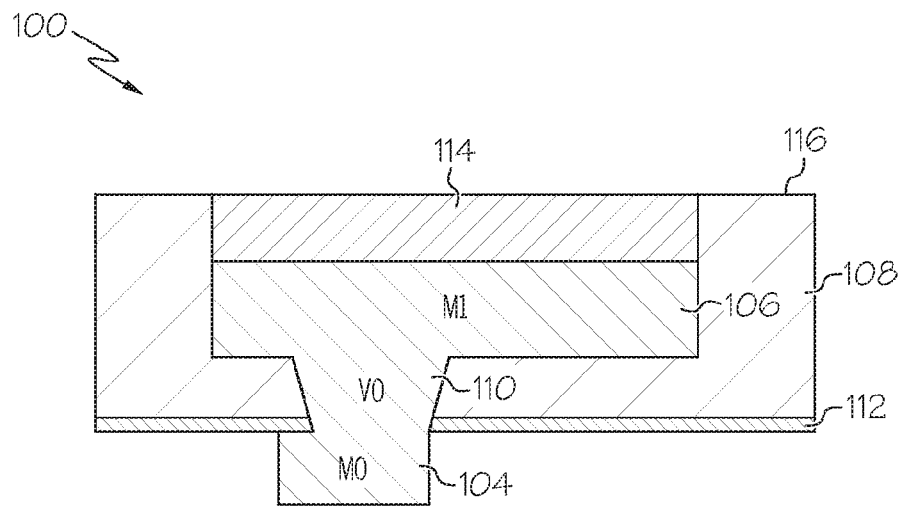
FIGS. 3(A)-(B) show side cross-sectional views of the semiconductor device including a capping layer formed over the recessed second metal line according to illustrative embodiments.
Figure 3B:
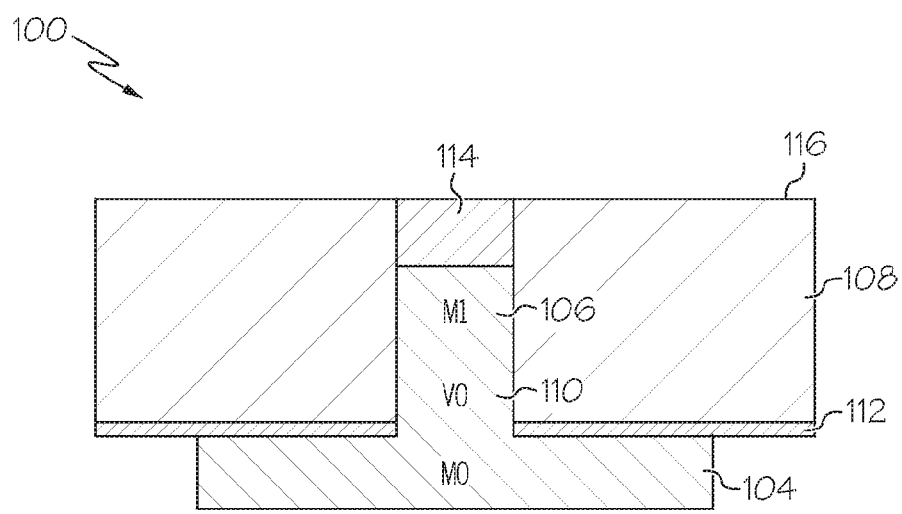

As shown in FIGS. 2(A)-(B), second metal line 106 is then recessed, e.g., using a reactive ion etch (RIE), and a dielectric capping layer 114 is then formed over recessed second metal line 106, as shown in FIGS. 3(A)-(B). In one embodiment, dielectric capping layer 114 is formed by depositing a silicon carbon nitride (NBLOCK) over second metal line 106, and then planarizing the NBLOCK selective to a top surface 116 of ULK dielectric 108.

Figure 4A:
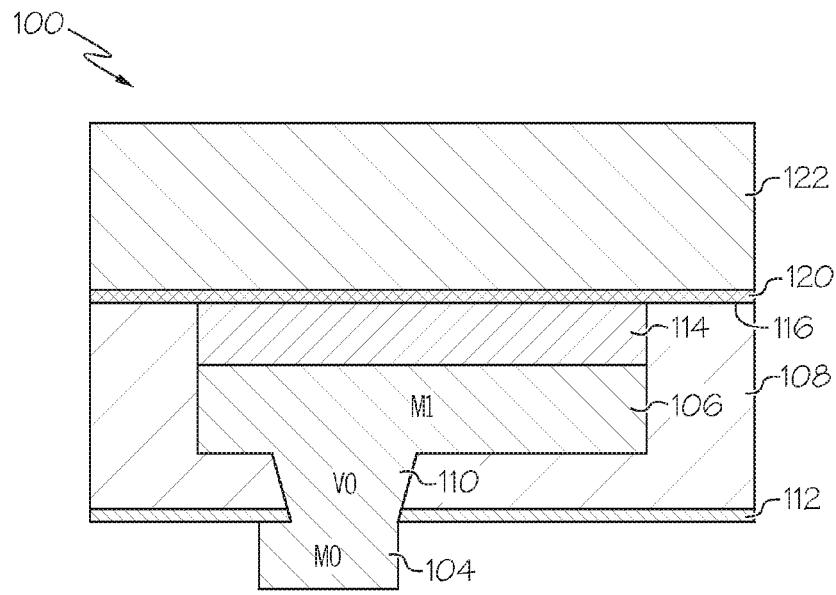
FIGS. 4(A)-(B) show side cross-sectional views of the semiconductor device including an etch stop layer and a sacrificial material formed over the capping layer according to illustrative embodiments.
Figure 4B:
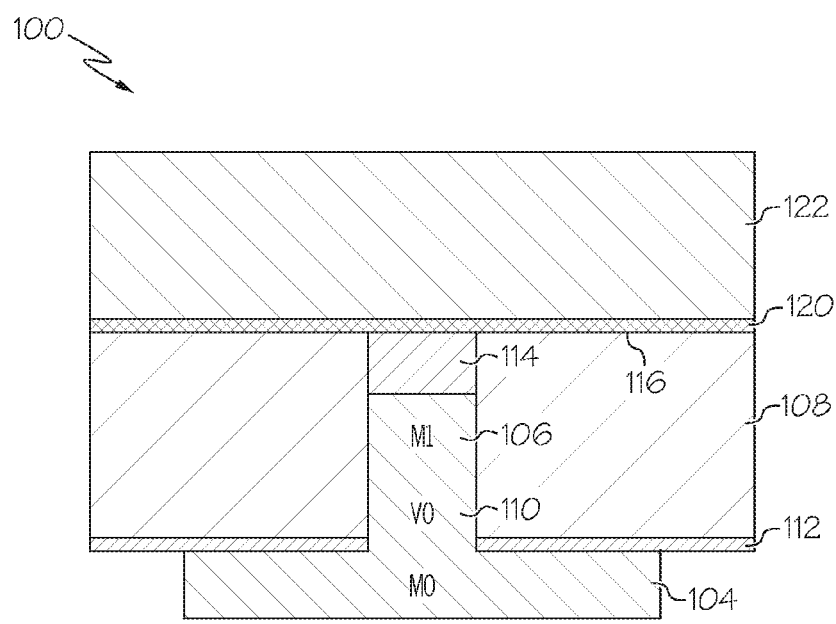
Figure 5A:
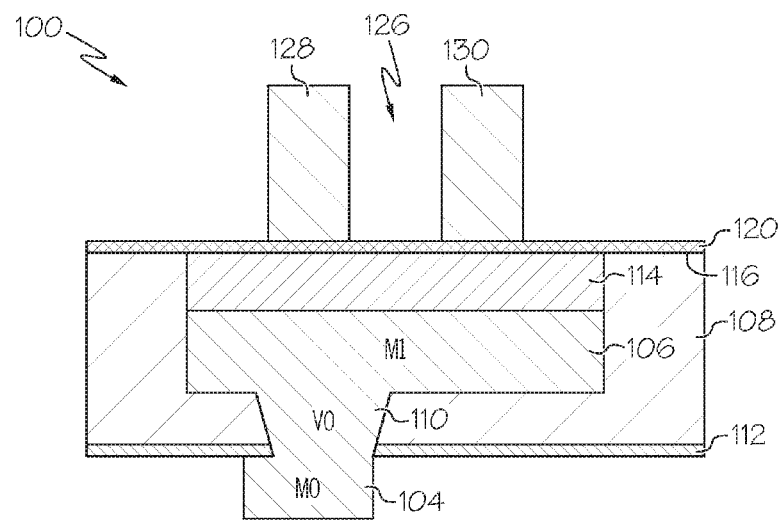
FIGS. 5(A)-(B) show side cross-sectional views of the semiconductor device including a patterned trench in the etch stop layer and the sacrificial material to form a set of sacrificial pillars according to illustrative embodiments.
Figure 5B:
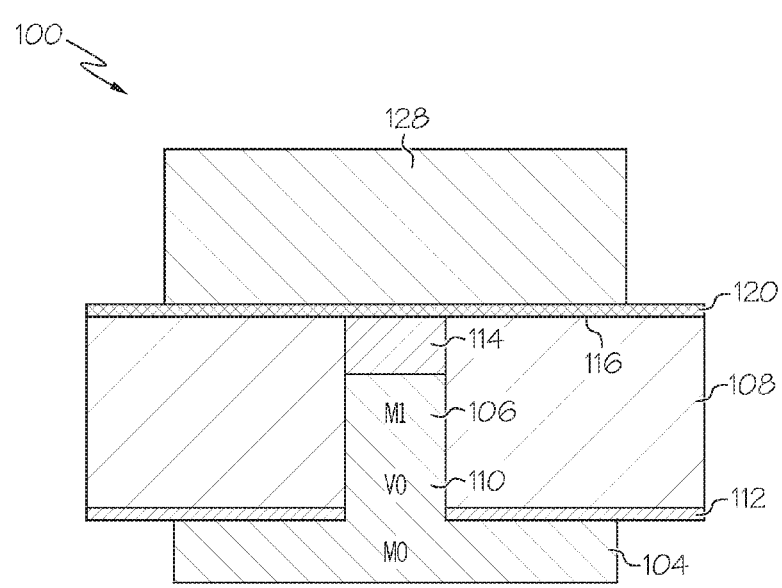

An etch stop layer 120 and a sacrificial material 122 are then formed over dielectric capping layer 114 and atop top surface 116 of ULK dielectric 108, as shown in FIGS. 4(A)-(B), and a trench 126 is formed in sacrificial material 122, selective to etch stop layer 120, to form a set of sacrificial pillars 128 and 130, as shown in FIGS. 5(A)-(B). In one non-limiting embodiment, etch stop layer 120 comprises aluminum oxide, and sacrificial material 122 comprises silicon nitride.

Figure 6A:
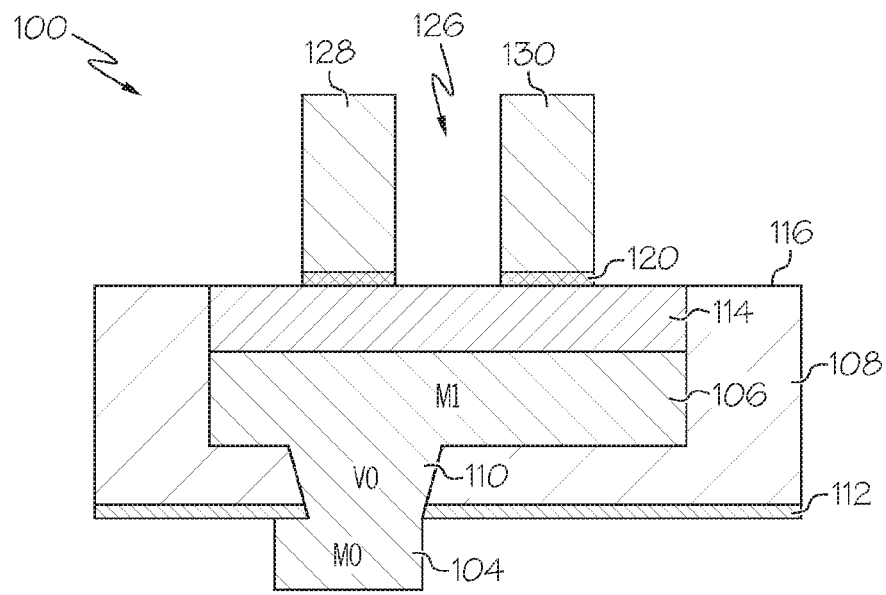
FIGS. 6(A)-(B) show side cross-sectional views of the semiconductor device following an etch to the etch stop layer according to illustrative embodiments.
Figure 6B:
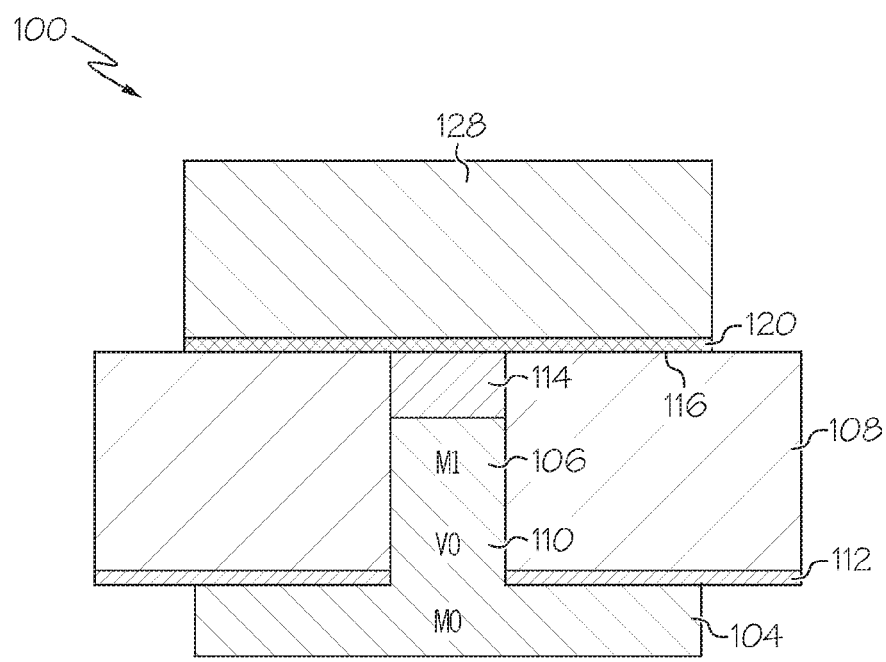
Figure 7A:
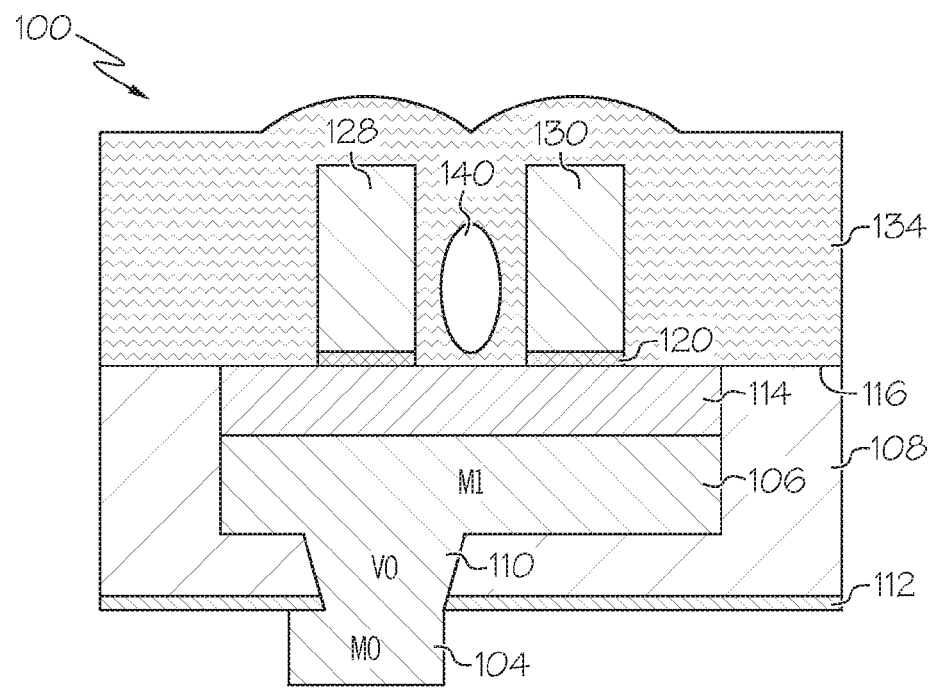
FIGS. 7(A)-(B) show side cross-sectional views of the semiconductor device following deposition of an ULK fill material according to illustrative embodiments.
Figure 7B:
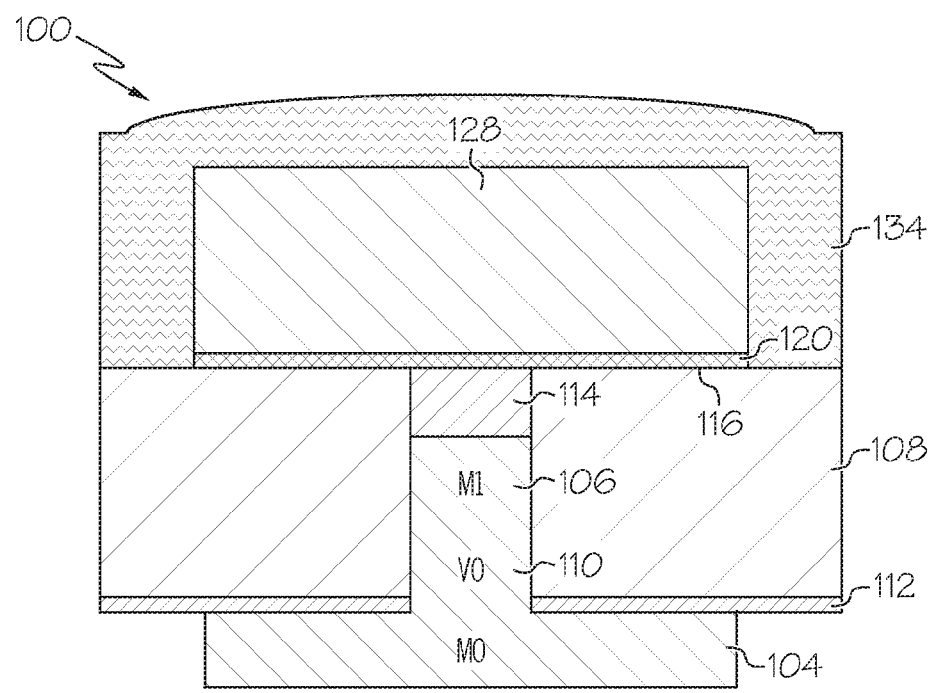

Next, as shown in FIGS. 6(A)-(B), the exposed etch stop layer 120 adjacent sacrificial pillars 128 and 130 is removed, e.g., using an anisotropic etch process. An ULK fill material 134 is then deposited over device 100, as shown in FIGS. 7(A)-(B), leaving an air gap 140 between set of sacrificial pillars 128 and 130. In this case, ULK fill material 134 is deposited using a non-conformal PECVD, which allows air gap 140 to be surrounded on all sides by ULK fill material 134. By doing so, a lower capacitance is generated due to air gap 140, while no damage is done to ULK fill material 134 from an etch process. Furthermore, air gap 140 is formed without the need for an extra mask. Instead, air gap 140 is self-forming by virtue of the tight pitch between set of sacrificial pillars 128 and 130. ULK fill material 134 conforms to dielectric capping layer 114 and set of sacrificial pillars 128 and 130, and pinches off towards a top portion of each sacrificial pillar.

Figure 8A:
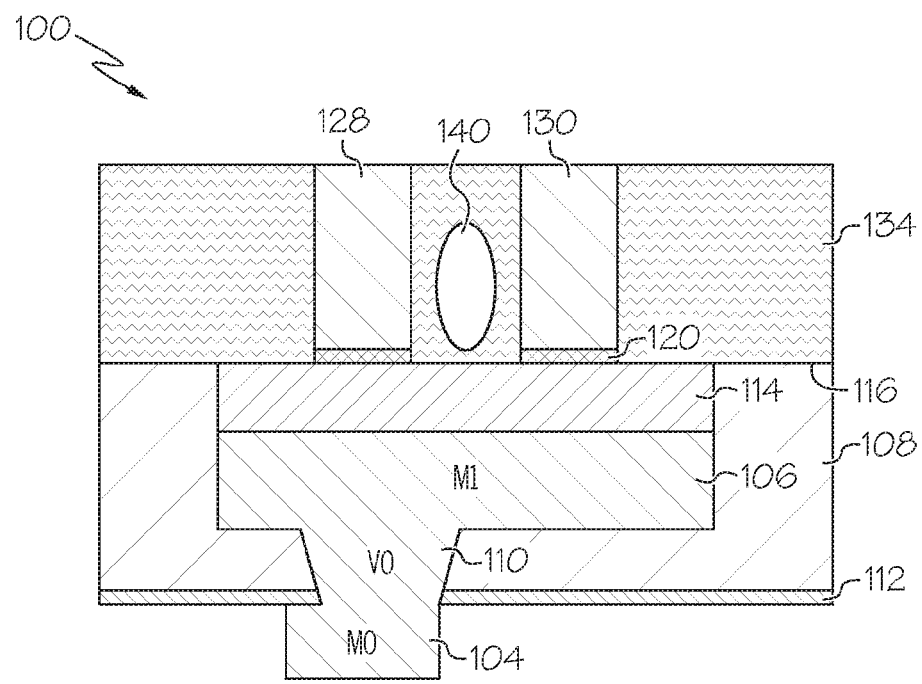
FIGS. 8(A)-(B) show side cross-sectional views of the semiconductor device following a chemical mechanical planarization (CMP) to the ULK fill material according to illustrative embodiments.
Figure 8B:
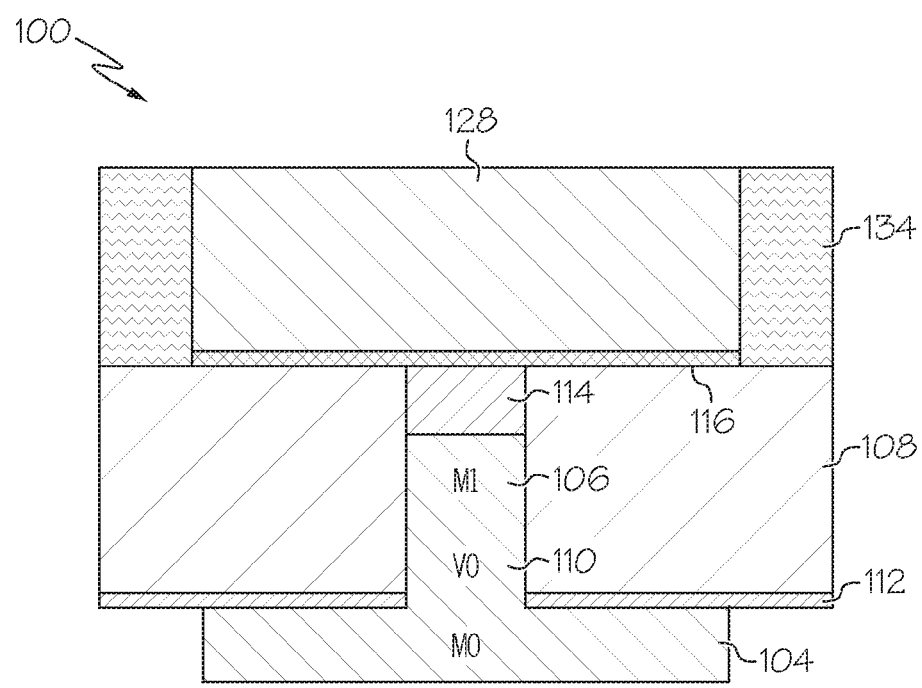
Figure 9A:
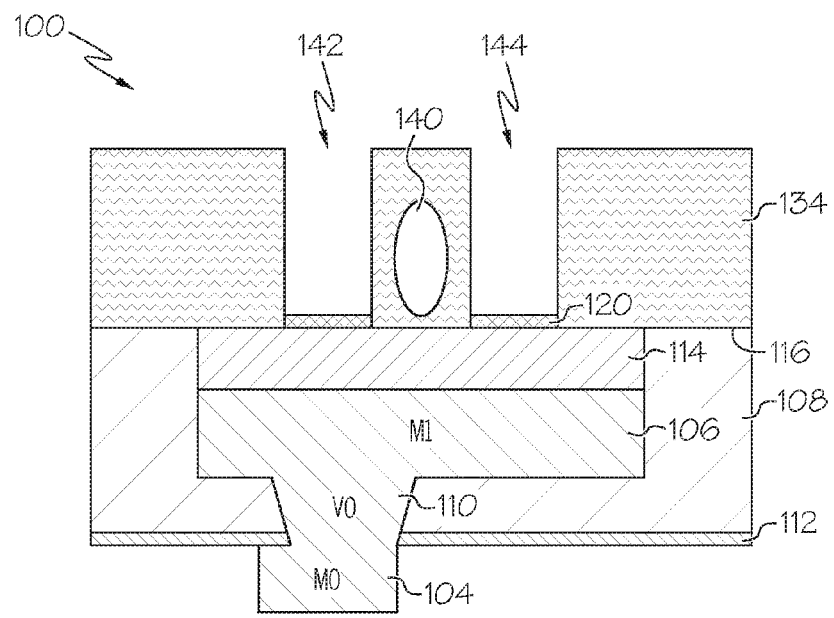
FIGS. 9(A)-(B) show side cross-sectional views of the semiconductor device following removal of the sacrificial material according to illustrative embodiments.
Figure 9B:
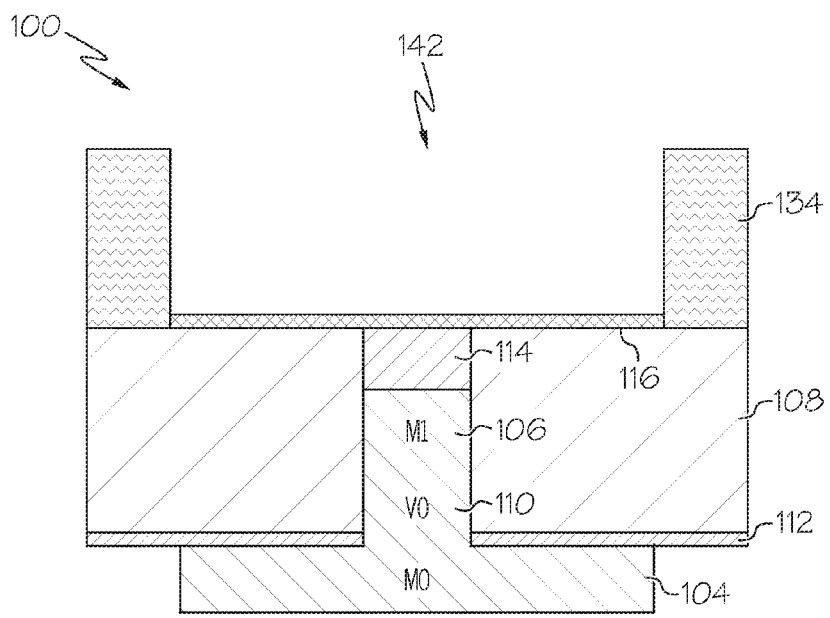
Figure 10A:
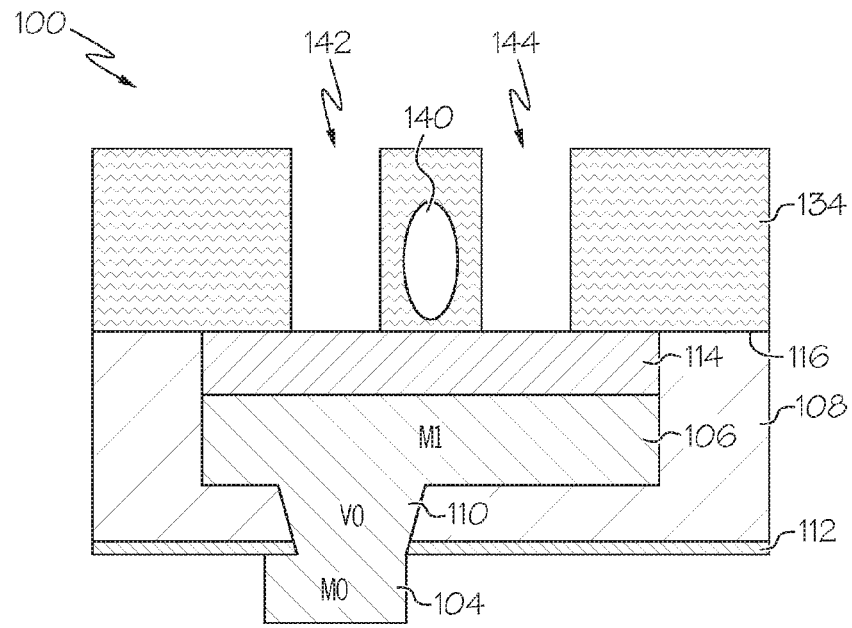
FIGS. 10(A)-(B) show side cross-sectional views of the semiconductor device following removal of the etch stop layer according to illustrative embodiments.
Figure 10B:
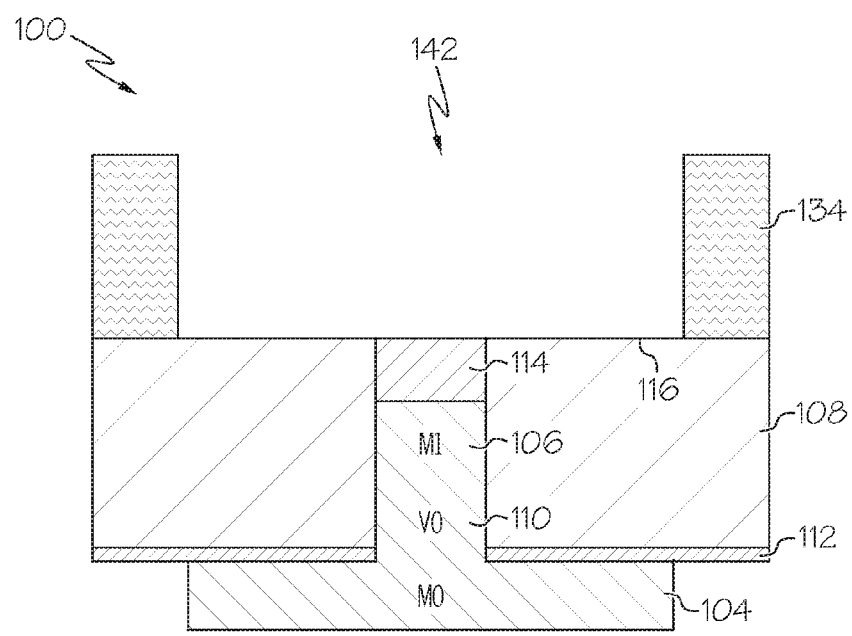
Figure 11A:
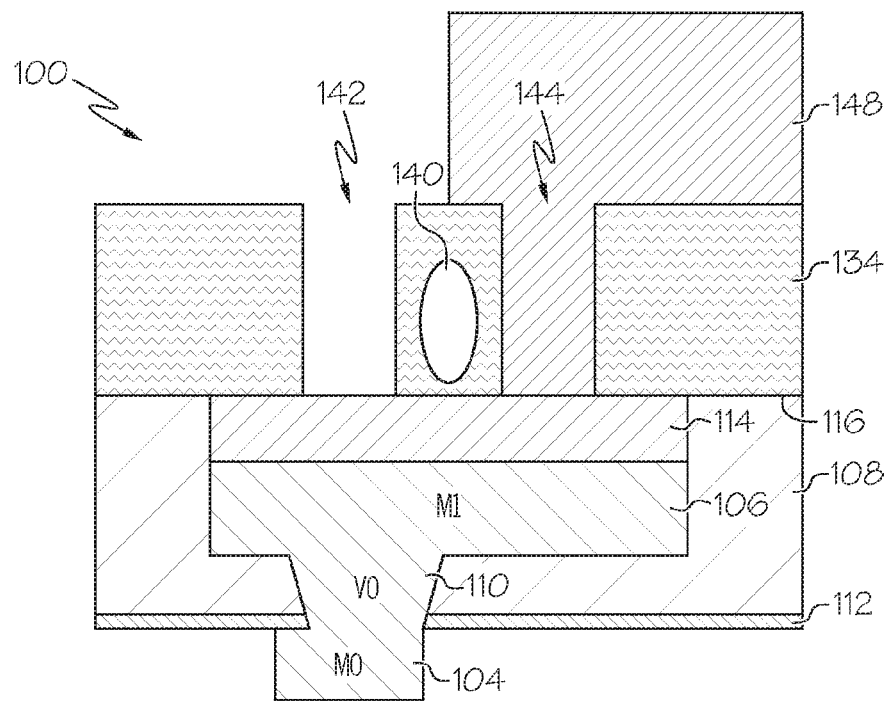
FIGS. 11(A)-(B) show side cross-sectional views of the semiconductor device following formation of a block mask according to illustrative embodiments.
Figure 11B:
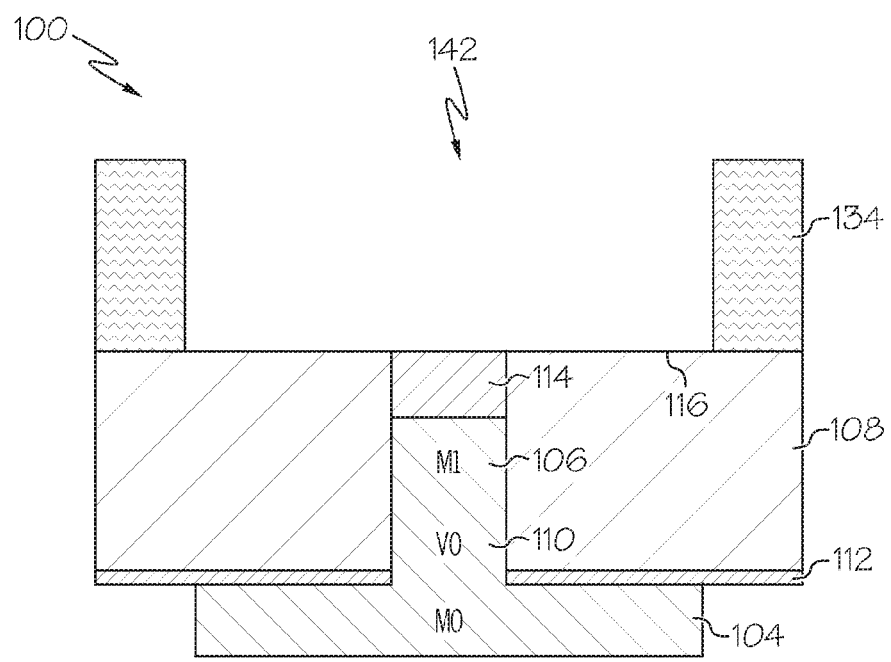

ULK fill material is then planarized (e.g., CMP) to a top surface of sacrificial pillars 128 and 130, as shown in FIGS. 8(A)-(B), and the sacrificial material and etch stop layer 120 of sacrificial pillars 128 and 130 is removed, as shown in FIGS. 9(A)-10(B). In one embodiment, the sacrificial material of set of sacrificial pillars 128 and 130 is removed selective to both etch stop layer 120 and ULK fill material 134 (e.g., using an AMAT frontier process), and etch stop layer 120 is then removed using a tetramethyl ammonium hydroxide (TMAH) etch selective to dielectric capping layer 114, thus forming a set of via openings 142 and 144, as shown in FIGS. 10(A)-(B).

Figure 12A:
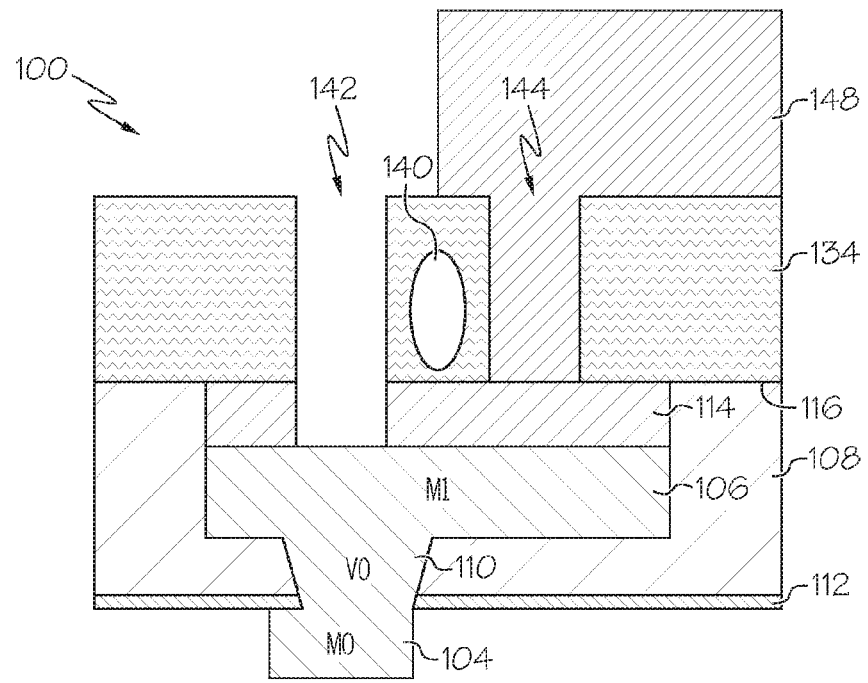
FIGS. 12(A)-(B) show side cross-sectional views of the semiconductor device following an etch to the capping layer formed over the recessed second metal line according to illustrative embodiments.
Figure 12B:
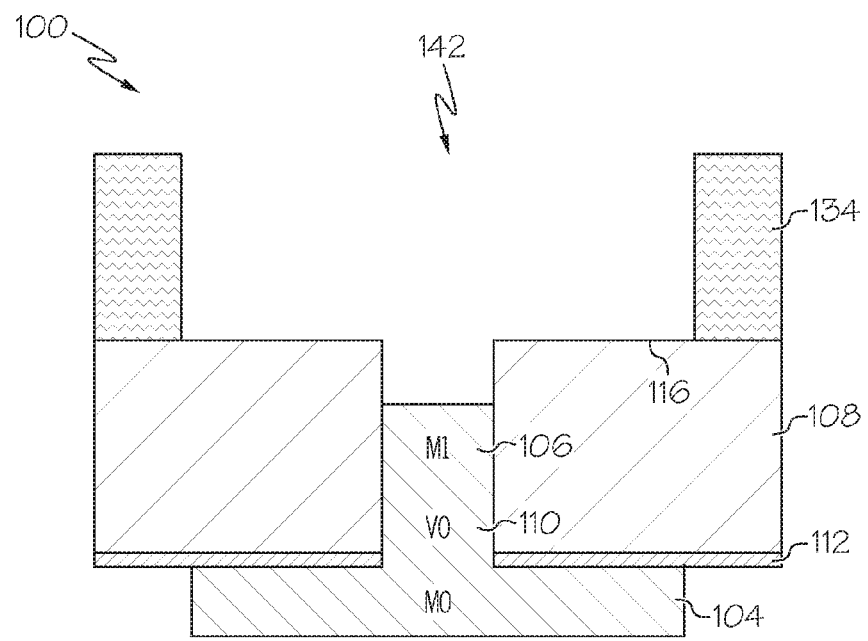
Figure 13A:
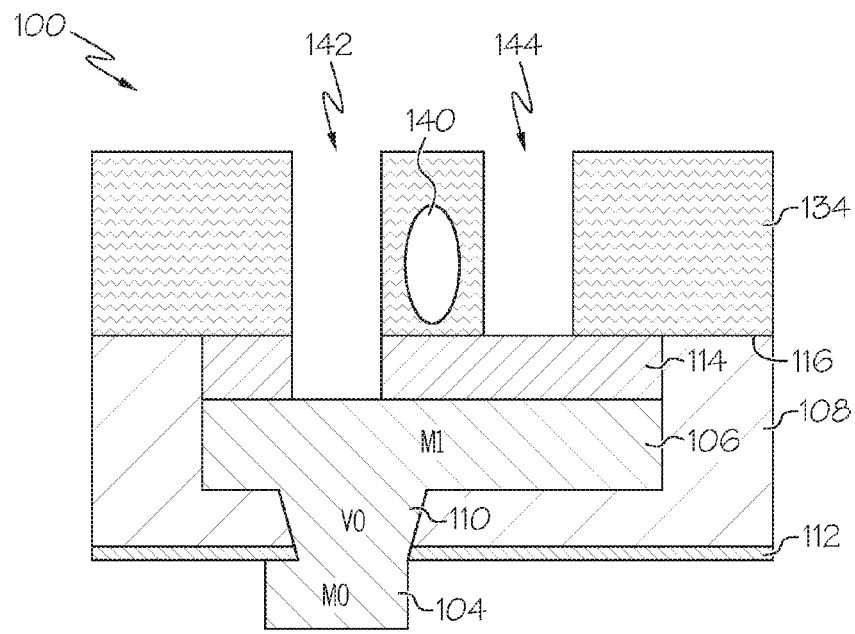
FIGS. 13(A)-(B) show side cross-sectional views of the semiconductor device following removal of the block mask according to illustrative embodiments.
Figure 13B:
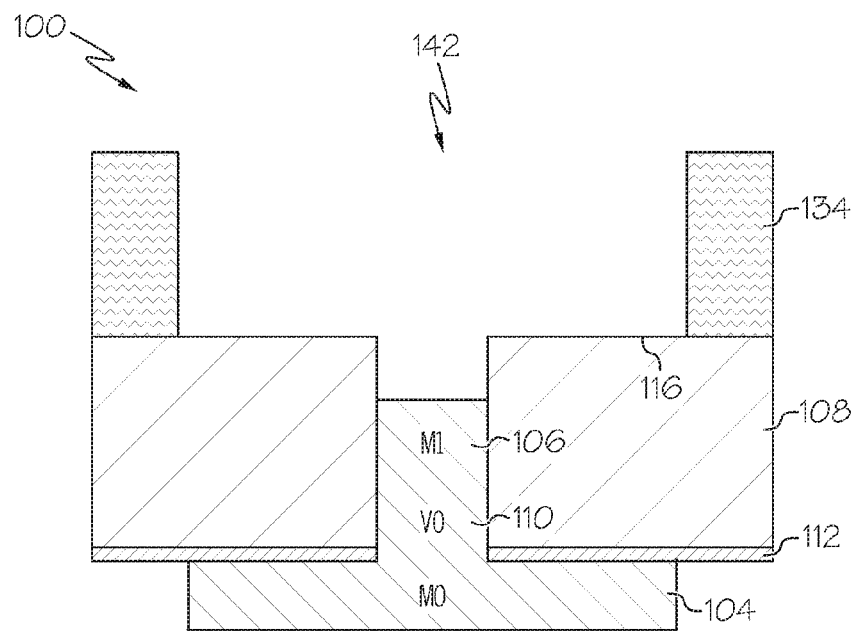
Figure 14A:
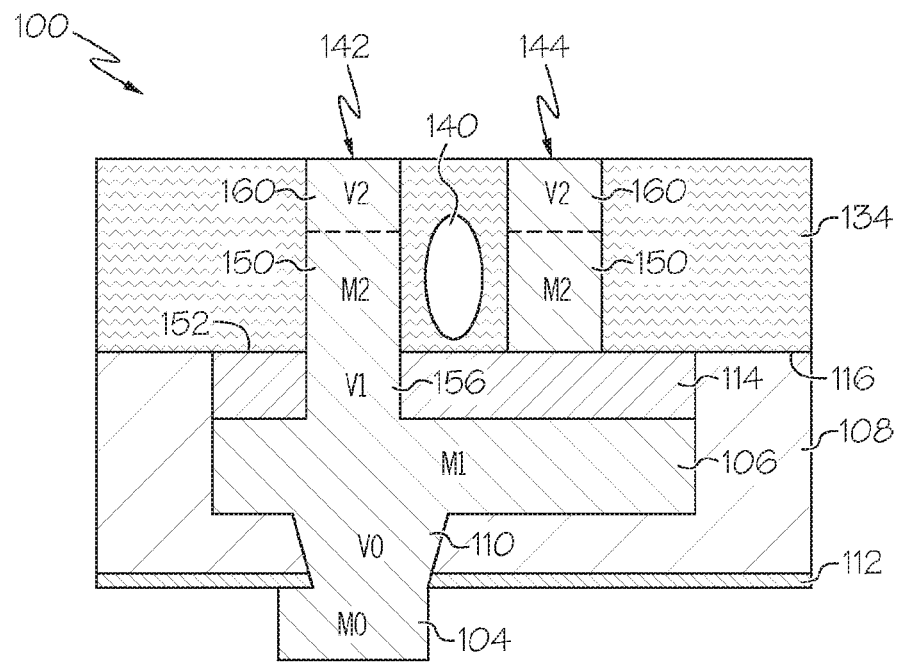
FIGS. 14(A)-(B) show side cross-sectional views of the semiconductor device following formation of a third metal line within a first via opening and a second via opening formed within the ULK fill material formed over the dielectric capping layer according to illustrative embodiments.
Figure 14B:
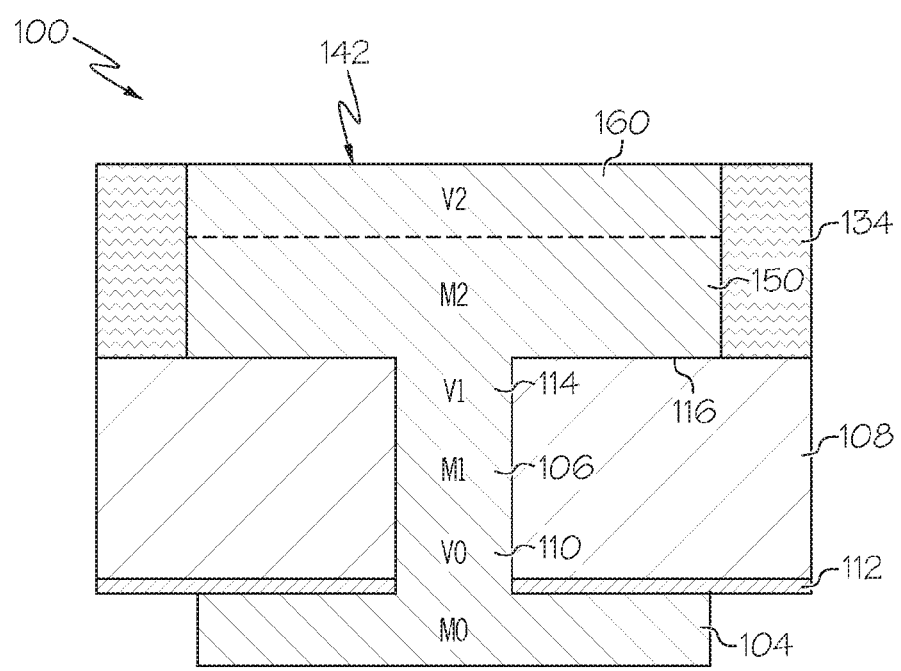

Next, a block mask 148 is formed over device 100 and within via opening 144, and dielectric capping layer 114 beneath via opening 142 is selectively etched, as shown in FIGS. 12(a)-(B). In this embodiment, dielectric capping layer 114 is removed to expose second metal line 106. Block mask 148 is then removed, as shown in FIGS. 13(A)-(B), and a metal material is deposited over device 100 to form a third metal line (M2) 150 within via openings 142 and 144, as shown in FIGS. 14(A)-(B). In one embodiment, the metal material is deposited and then planarized to a top surface of ULK fill material 134. As shown, third metal line 150 within via opening 144 extends down to a top surface 152 of dielectric capping layer 114, and third metal line 150 within via opening 142 connects to second metal (M1) 106 by a second via (V1) 156 passing through dielectric capping layer 114.

Figure 15A:
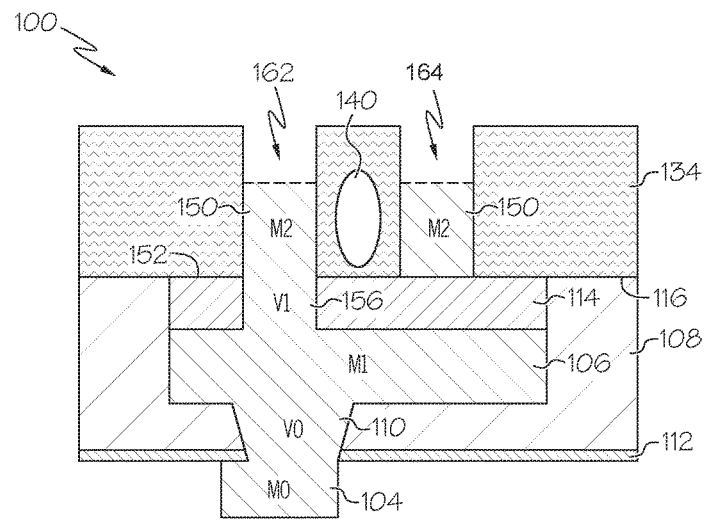
FIGS. 15(A)-(B) show side cross-sectional views of the semiconductor device following a recess of the third metal line within the first via opening and the second via opening to form a next-level self-aligned via of a third metal line according to illustrative embodiments.
Figure 15B:
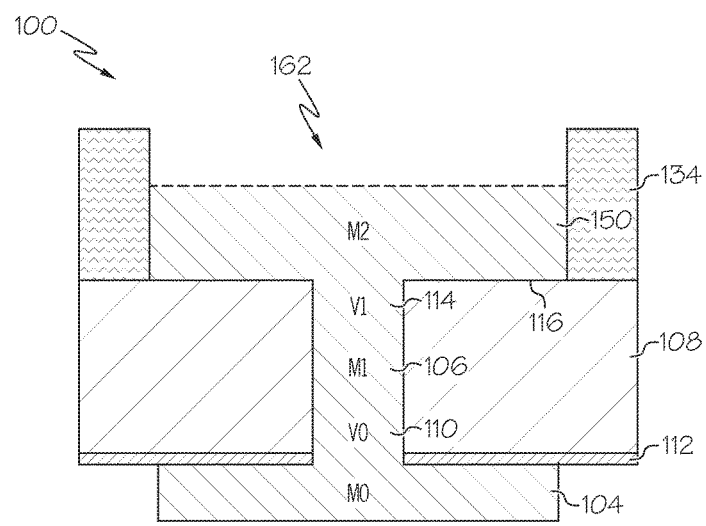

As further shown, a top section of the metal material of third metal line 150 represents a third via metal (V2) 160, which is then recessed to become a next level's full SAV. That is, third via metal 160 is recessed within the via openings to form a set of next-level self-aligned vias 162 and 164, as shown in FIGS. 15(A)-(B).

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for forming a SAV and air gap in a semiconductor device. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor device comprising:
    a first metal line beneath a second metal line, wherein the second metal line is within an ultra low-k (ULK) dielectric, and the first metal line is connected to the second metal line by a first via;
    a dielectric capping layer formed over and in contact with the second metal line;
    a third metal line within a first via opening and a second via opening formed within an ultra low-k (ULK) fill material formed over the dielectric capping layer, wherein the third metal line within the first via opening extends to a top surface of the dielectric capping layer, and wherein the third metal line within the second via opening is connected to the second metal line by a second via passing through the dielectric capping layer; and
    an air gap formed between the third metal line within the first via opening and the third metal line within the second via opening.

2. The semiconductor according to claim 1, further comprising another dielectric layer between the first metal line and the ULK dielectric.

3. The semiconductor device according to claim 2, wherein the dielectric capping layer and the another dielectric layer each comprise a silicon carbon nitride (NBLOCK).

4. The semiconductor device according to claim 1, wherein the air gap is surrounded on all sides by the ULK fill material.

5. The semiconductor device according to claim 1, wherein the ULK dielectric is selected from a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric.

6. The semiconductor device according to claim 1, wherein a top surface of the third metal line is below a top surface of the ULK fill material formed over the dielectric capping layer.

7. A semiconductor device, comprising:
    a first metal line;
    an ultra low-k (ULK) dielectric layer disposed above the first metal line;
    a second metal line disposed within the ULK dielectric layer;
    a first via connecting the first metal line and the second metal line;
    a dielectric capping layer disposed on and in contact with the second metal line;
    a ULK fill material disposed on the ULK dielectric layer and the dielectric capping layer, and comprising a first opening, a second opening, and region between the first opening and the second opening, wherein the region comprises an air gap;
    a third metal line disposed in the first opening and the second opening, wherein a top surface of the third metal line is below a top surface of the ULK fill material; and
    a second via connecting the second metal line and the third metal line.

8. The semiconductor device of claim 7, further comprising a first dielectric layer between the first metal line and the ULK dielectric layer.

9. The semiconductor device of claim 8, wherein the dielectric capping layer and the first dielectric layer each comprise a silicon carbon nitride (NBLOCK).

10. The semiconductor device of claim 7, wherein the air gap is surrounded on all sides by the ULK fill material.

11. The semiconductor device of claim 7, wherein the ULK dielectric layer comprises a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric.

12. The semiconductor device of claim 7, wherein the first metal line and the third metal line extend in a first direction and the second metal line extends in a second direction perpendicular to the first direction.

* * * * *